(12) United States Patent
Laighton et al.

(10) Patent No.: US 11,146,223 B2
(45) Date of Patent: Oct. 12, 2021

(54) HIGH POWER RADIO FREQUENCY (RF) AMPLIFIERS

(71) Applicant: Raytheon Company, Waltham, MA (US)

(72) Inventors: Christopher M. Laighton, Boxborough, MA (US); Susan C. Trulli, Lexington, MA (US); Elicia K. Harper, Chelsea, MA (US)

(73) Assignee: RAYTHEON COMPANY, Waltham, MA (US)

( * ) Notice: Subject to any disclaimer, the term of this patent is extended or adjusted under 35 U.S.C. 154(b) by 72 days.

(21) Appl. No.: 16/458,902

(22) Filed: Jul. 1, 2019

(65) Prior Publication Data

US 2021/0006213 A1    Jan. 7, 2021

(51) Int. Cl.
*H03F 3/21*    (2006.01)
*H03F 1/32*    (2006.01)

(52) U.S. Cl.
CPC .......... *H03F 3/211* (2013.01); *H03F 1/3241* (2013.01); *H03F 2200/198* (2013.01); *H03F 2200/451* (2013.01)

(58) Field of Classification Search
CPC ...................................................... H03F 3/211
See application file for complete search history.

(56) References Cited

U.S. PATENT DOCUMENTS

| | | | |
|---|---|---|---|
| 10,193,512 B1 * | 1/2019 | Schuster | ................. H03F 3/195 |
| 2006/0006937 A1 * | 1/2006 | Burns | ..................... H03F 3/602 |
| | | | 330/124 R |
| 2006/0164163 A1 * | 7/2006 | Apel | ......................... H03F 3/72 |
| | | | 330/151 |
| 2007/0205827 A1 * | 9/2007 | Mobbs | .................... H03F 3/602 |
| | | | 330/124 R |
| 2010/0045385 A1 | 2/2010 | Pengelly | |
| 2012/0154054 A1 * | 6/2012 | Kaczman | ................ H03F 3/211 |
| | | | 330/295 |
| 2012/0190316 A1 | 7/2012 | Martineau et al. | |
| 2012/0200356 A1 * | 8/2012 | Bendixen | ................ H03F 3/211 |
| | | | 330/190 |

(Continued)

FOREIGN PATENT DOCUMENTS

EP      3 439 172 A1    2/2019

OTHER PUBLICATIONS

Notification of Transmittal of the International Search Report and the Written Opinion of the ISA dated Sep. 9, 2020 for International Application No. PCT/US2020/036772; 1 page.

(Continued)

*Primary Examiner* — Patricia T Nguyen
(74) *Attorney, Agent, or Firm* — Daly, Crowley, Mofford & Durkee, LLP (57) ABSTRACT

A power amplifier having: a plurality of N amplifier modules, where N is an integer greater than one; an M:N power splitter having M inputs, where M is an integer less than N, and N outputs, each one of the N outputs being coupled to an input of a corresponding one of the plurality of N power amplifiers; a plurality of M delay lines, each one the M delay lines having an output coupled to a corresponding one of the M inputs of the M:N power splitter, each one of the plurality of M delay lines being coupled to a common input of the power amplifier.

8 Claims, 7 Drawing Sheets

(56) References Cited

U.S. PATENT DOCUMENTS

| | | | |
|---|---|---|---|
| 2012/0256684 A1* | 10/2012 | Sorrells | H03F 1/0294 330/69 |
| 2014/0077874 A1 | 3/2014 | Ahmed et al. | |
| 2016/0065141 A1* | 3/2016 | Yoshikawa | H03F 3/19 330/295 |
| 2016/0164466 A1* | 6/2016 | Britta | H03F 1/0227 330/295 |
| 2019/0165739 A1* | 5/2019 | Lyalin | H03F 3/211 |

OTHER PUBLICATIONS

International Search Report dated Sep. 9, 2020, for International Application No. PCT/US2020/036772; 5 pages.
Written Opinion of the ISA dated Sep. 9, 2020 for International Application No. PCT/US2020/036772; 9 pages.

* cited by examiner

HIGH POWER RADIO FREQUENCY (RF) AMPLIFIERS

TECHNICAL FIELD

This disclosure relates generally to high power radio frequency (RF) amplifiers and more particularly, to high power RF amplifiers having a plurality of amplifier modules coupled to a common input.

BACKGROUND OF THE INVENTION

Figure 1:
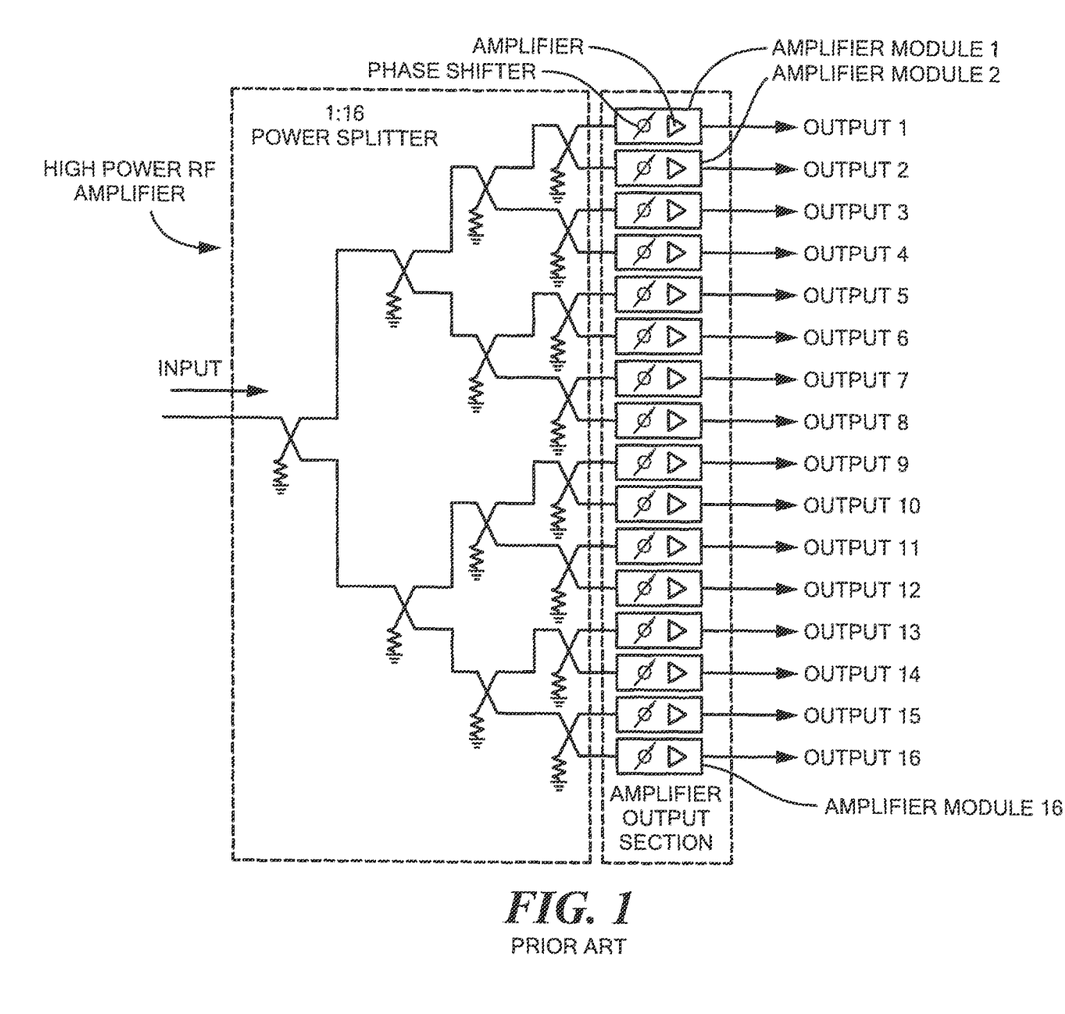
FIG. 1 is a schematic diagram of a high power RF power amplifier according to the PRIOR ART.

As is known in the art, many high power radio frequency (RF) amplifiers include a plurality of amplifier modules coupled to a common input through a power splitter; each one of the amplifier modules producing a corresponding one of a plurality of outputs. One such power amplifier is shown in FIG. 1, here in this example, having sixteen amplifier modules 1-16 producing outputs at a corresponding one of 16 outputs 1-16, as shown. The power RF amplifier includes a one to sixteen power splitter for dividing power of an RF signal at the input equally among the sixteen amplifier modules. Each one of the amplifier modules includes an adjustable phase shifter coupled between an output of a corresponding one of the power splitter and the input to such one of the amplifier modules, as shown. Since each one of the amplifier modules typically, when fabricated, will have a different phase shift through it, the phase shifters are adjusted during manufacture of the RF power amplifier so that the output signal from all of the sixteen amplifier modules are all in-phase with one another. That is, the signals at the outputs 1-16 are all in-phase. However, tuning each one of the plurality of phase shifters is time consuming.

SUMMARY OF THE INVENTION

In accordance with the present disclosure, a power amplifier is provided having: a plurality of N amplifiers, where N is an integer greater than one; an M:N power splitter having inputs, where M is an integer less than N, and N outputs, each one of the N outputs being coupled to an input of a corresponding one of the plurality of N amplifiers; and, a plurality of M delay lines, each one the M delay lines having an output coupled to a corresponding one of the M inputs of the plurality of the M:N power splitter, each one of the plurality of M delay lines being coupled to a common input of the power amplifier.

In one embodiment, the M:N power splitter and the M delay lines are disposed on a common printed circuit board.

In one embodiment, the amplifier includes a 1:M power splitter having M outputs, each one of the M outputs being coupled to an input of a corresponding one of the M delay lines.

In one embodiment, the N amplifiers are arranged in M amplifier module sections, each one of the M amplifier module sections having N/M of the amplifiers, each one of the N/M amplifiers in a corresponding one of the M amplifier module sections having a phase shift $(\Delta_1+/-\delta)$ degrees through $(\Delta_M\pm/-\delta)$ degrees, respectively, and where each one of the M delay lines has a phase shift $\Delta_1$ through $\Delta_M$ respectively.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 2:
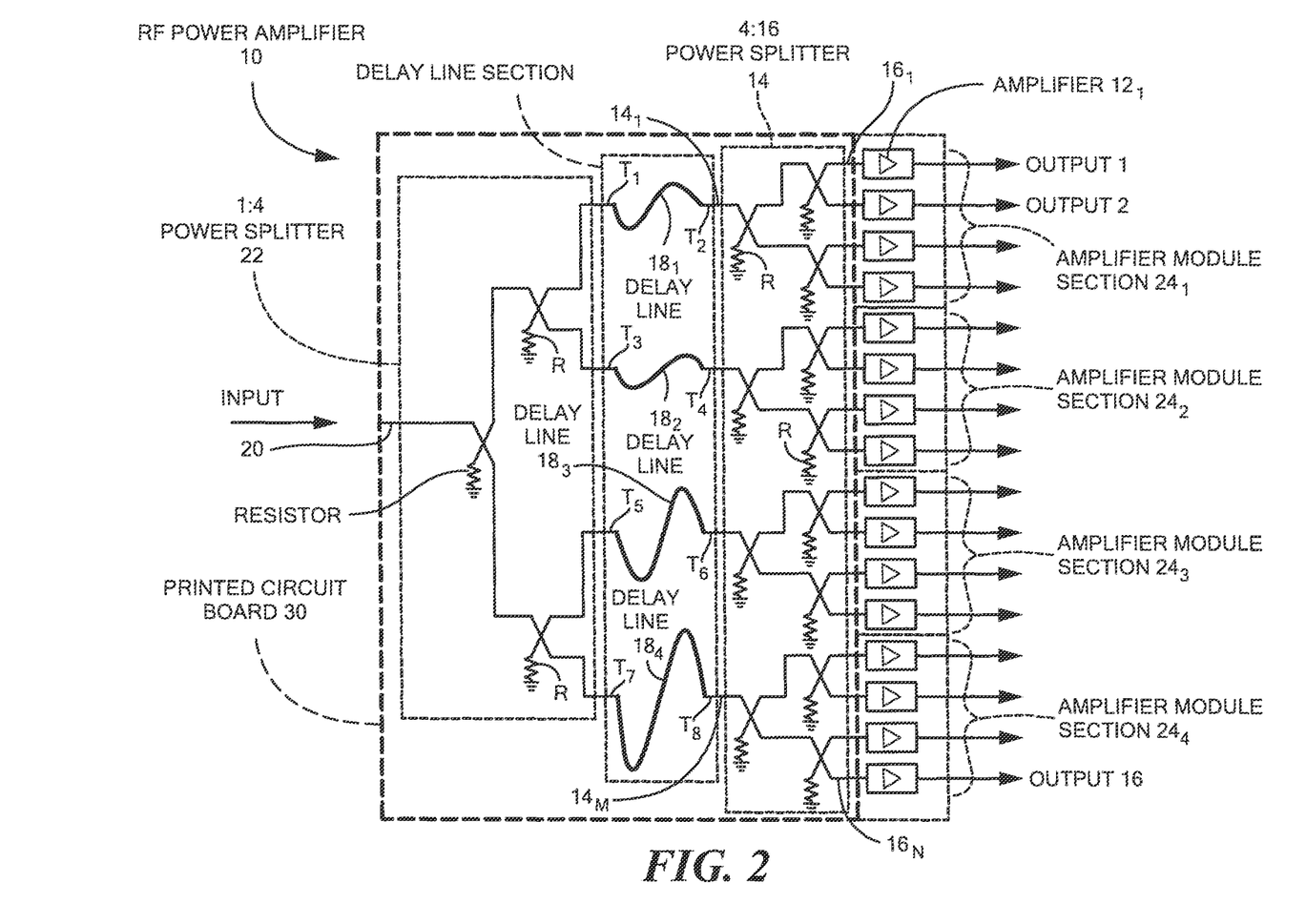
FIG. 2 is a is a schematic diagram of a high power RF power amplifier according to the disclosure.

Referring now to FIG. 2, a high power RF amplifier 10 is shown having; a plurality of N amplifiers $12_1$-$12_N$ where N is an integer greater than one, here in this example N is sixteen; an M:N power splitter 14 having M inputs $14_1$-$14_M$, where M is an integer less than N, here in this example, M is four, and N outputs $16_1$-$16_M$, each one of the N outputs $16_1$-$16_M$ being coupled to an input $14_1$-$14_M$ of a corresponding one of the plurality of N amplifiers $12_1$-$12_N$; and, a plurality of M delay lines $18_1$-$18_M$, each one the M delay lines $18_1$-$18_M$ having an output T2, T4, T6, and T8, respectively, coupled to a corresponding one of the M inputs $14_1$-$14_M$ of the plurality of the M:N power splitter 14, each one of the plurality of M delay lines $18_1$-$18_M$ having an input T1, T3, T5 and T7, respectively, being coupled to a common input 20 of the power amplifier 10; here though a 1:N power splitter 22. It is noted that the 1:N power splitter and the M:N power splitter 14 are of conventional design and include conventional matched termination resistors R, here 50 ohms; the microwave transmission lines used to form the power splitters 14 and 22 as well as the and the delay lines $18_1$-$18_M$ here being in this example, 50 ohm microstrip transmission lines. Thus, there are, in this example, sixteen channels from the input 20 to a corresponding one of the sixteen outputs OUTPUT 1-OUTPUT 16.

Here, in this example, a plurality of amplifiers is fabricated and the phase shift through each one at the nominal operating frequently is measured and recorded. A predetermined tolerance $+/-\delta$ from a predetermined phase shift $\Delta_1$ through $\Delta_M$ is selected for each one of the M amplifier module sections $24_1$-$24_M$. Here for example, the predetermined tolerance $\delta$ is selected as five degrees and the predetermined phase shift $\Delta_1$ through $\Delta_M$ are in this example selected as: $\Delta_1$=20 degrees, $\Delta_1$+10=30 degrees, $\Delta_1$+20=40 degrees and $\Delta_1$+30=50 degrees, for the M amplifier module sections $24_1$-$24_M$ respectively.

In this example, sixteen of the fabricated amplifiers are selected having the following phase shifts, in degrees: 16, 17, 22, 24, 26, 31, 34, 35, 36, 37, 42, 44, 48, 49, 52 and 53.

The selected amplifiers are arranged in the M amplifier module sections $24_1$-$24_M$ as follows:

| Amplifier | | Original Measured Phase Shift (Degrees) | Target Phase Shift per channel | Delay Line for Amplifier Module Section | Effective phase (degrees) per output channel |
|---|---|---|---|---|---|
| Amplifier Module Section $24_1$ | $12_1$ | 22 | 0 Degrees | Amplifier Module Section $24_1$ -20 Degrees | OUTPUT 1 = +2 |
| | $12_2$ | 17 | | | OUTPUT 2 = −3 |
| | $12_3$ | 24 | | | OUTPUT 3 = +4 |
| | $12_4$ | 16 | | | OUTPUT 4 = −4 |
| Amplifier Module Section $24_2$ | $12_5$ | 26 | | Amplifier Module Section $24_2$ -30 Degrees | OUTPUT 5 = −4 |
| | $12_6$ | 31 | | | OUTPUT 6 = 1 |
| | $12_7$ | 34 | | | OUTPUT 7 = 4 |
| | $12_8$ | 35 | | | OUTPUT 8 = 5 |
| Amplifier Module Section $24_3$ | $12_9$ | 36 | | Amplifier Module Section $24_3$ -40 Degrees | OUTPUT 9 = 4 |
| | $12_{10}$ | 44 | | | OUTPUT 10 = 4 |
| | $12_{11}$ | 42 | | | OUTPUT 11 = 2 |
| | $12_{12}$ | 37 | | | OUTPUT 12 = −3 |
| Amplifier Module Section $24_4$ | $12_{13}$ | 48 | | Amplifier Module Section $24_4$ -50 Degrees | OUTPUT 13 = −2 |
| | $12_{14}$ | 53 | | | OUTPUT 14 = 3 |
| | $12_{15}$ | 52 | | | OUTPUT 15 = −2 |
| | $12_{16}$ | 49 | | | OUTPUT 16 = −1 |

It is noted that the N amplifiers $12_1$-$12_{16}$ are arranged in M amplifier module sections $24_1$-$24_M$, each one of the M amplifier module sections $24_1$-$24_M$ having N/M (here 4) of the amplifiers $12_1$-$12_N$, each one of the N/M amplifiers $12_1$-$12_N$ in a corresponding one of the M amplifier module sections $24_1$-$24_M$ having a phase shift ($\Delta_1$+/−$\delta$) degrees through ($\Delta_M$+/−$\delta$) degrees, respectively, and where each one of the M delay lines $18_1$-$18_M$ has a phase shift $\Delta_1$ through $\Delta_M$ respectively.

It should be noted that the 1:M power splitter 22 and M:N power splitter 14 and the M delay lines $18_1$-$18_4$ are disposed on a common printed circuit board 30 as microstrip microwave transmission lines and also formed on the printed circuit board 30 are the resistors R.

Referring now to FIGS. 3A-3E plan views of various stages in the fabrications of the printed circuit 30 portion of the high RF power amplifier 10 are shown. Thus, shows the 1:M power splitter 22, M:N power splitter 14 and the resistors R. Here the 1:M power splitter 22 and the M:N power splitter 14 are microstrip transmission lines formed by strip conductors 31 formed on the upper surface 33 of a dielectric board 35 and a ground plane conductor, not shown, formed on the bottom surface of the dielectric board 35. One end of the resistors R is connected to the strip conductors 31, as shown, and the other end of the resistors is connected to the ground plane conductor (not shown) through conductive vias VIA, as indicated.

Figure 3A:
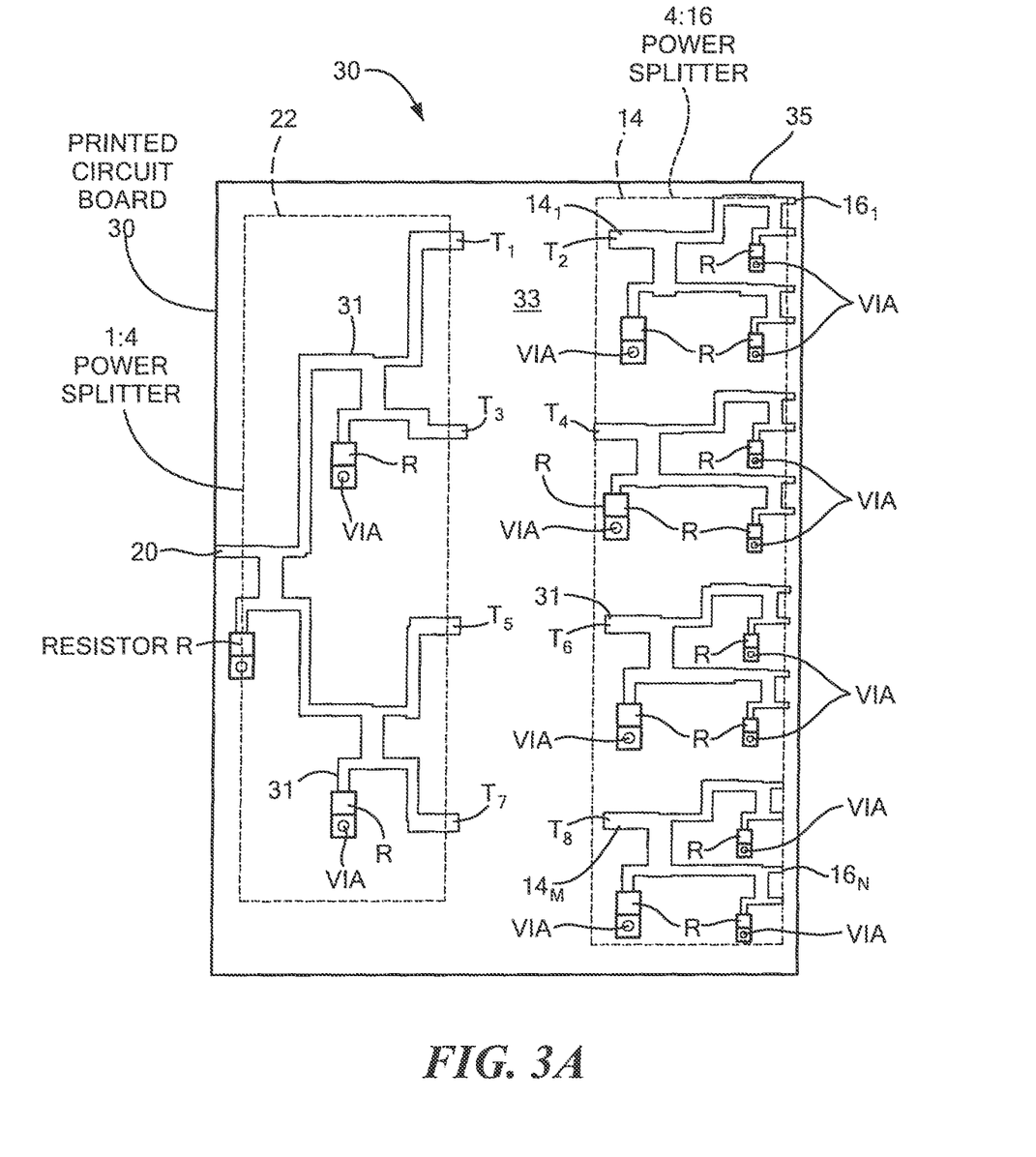
FIGS. 3A-3E are plan views of an upper surface of a printed circuit board having a 1:M power splitter, M:N power splitter, M delay lines $18_1$-$18_4$, and resistors for use with the the high RF power amplifier of FIG. 2 at various stages in the fabrications thereof.
Figure 3B:
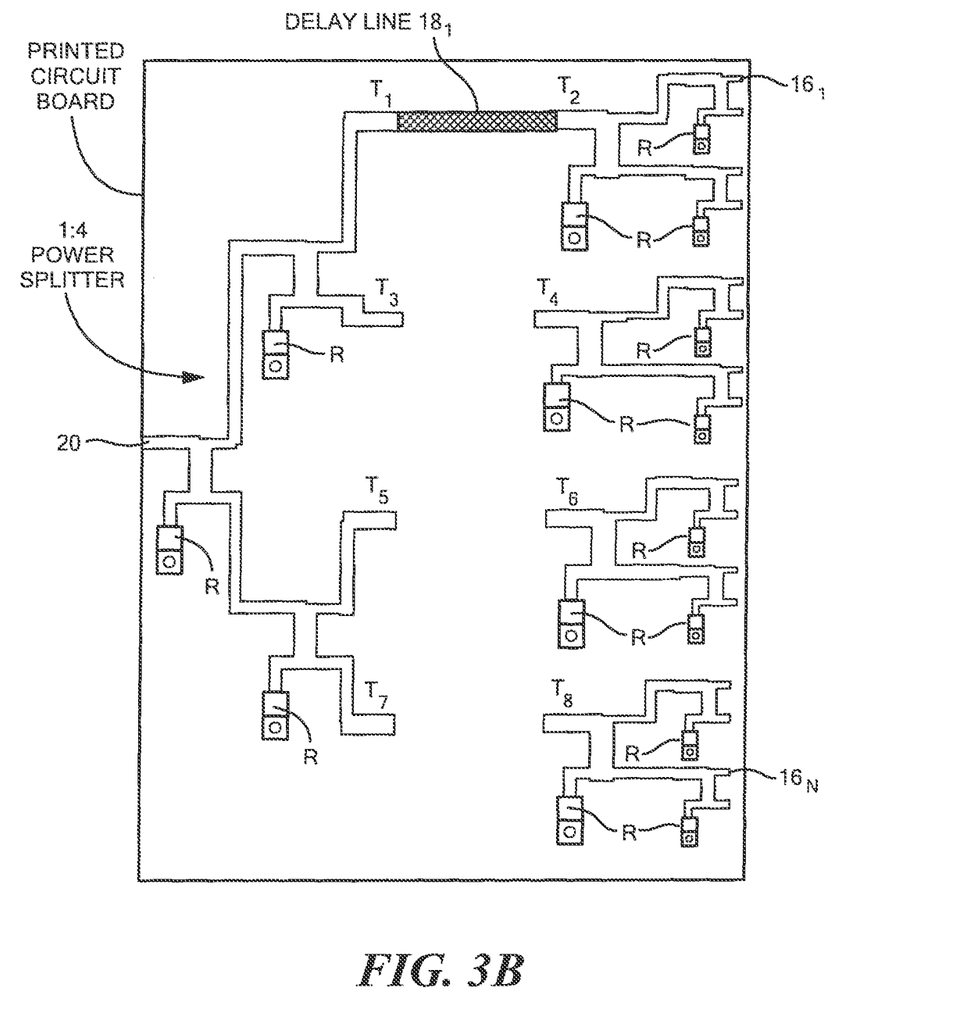

After forming the printed circuit board 30 as in FIG. 3A, the delay lines $18_1$-$18_4$ are formed as microstrip transmission lines; the ground plane being provided by the ground plane (not shown) formed on the back of the dielectric board 35. The strip conductor of the microstrip transmission line for the first delay line $18_1$ is printed using additive manufacturing or 3D printing as shown in FIG. 3B.

Figure 3C:
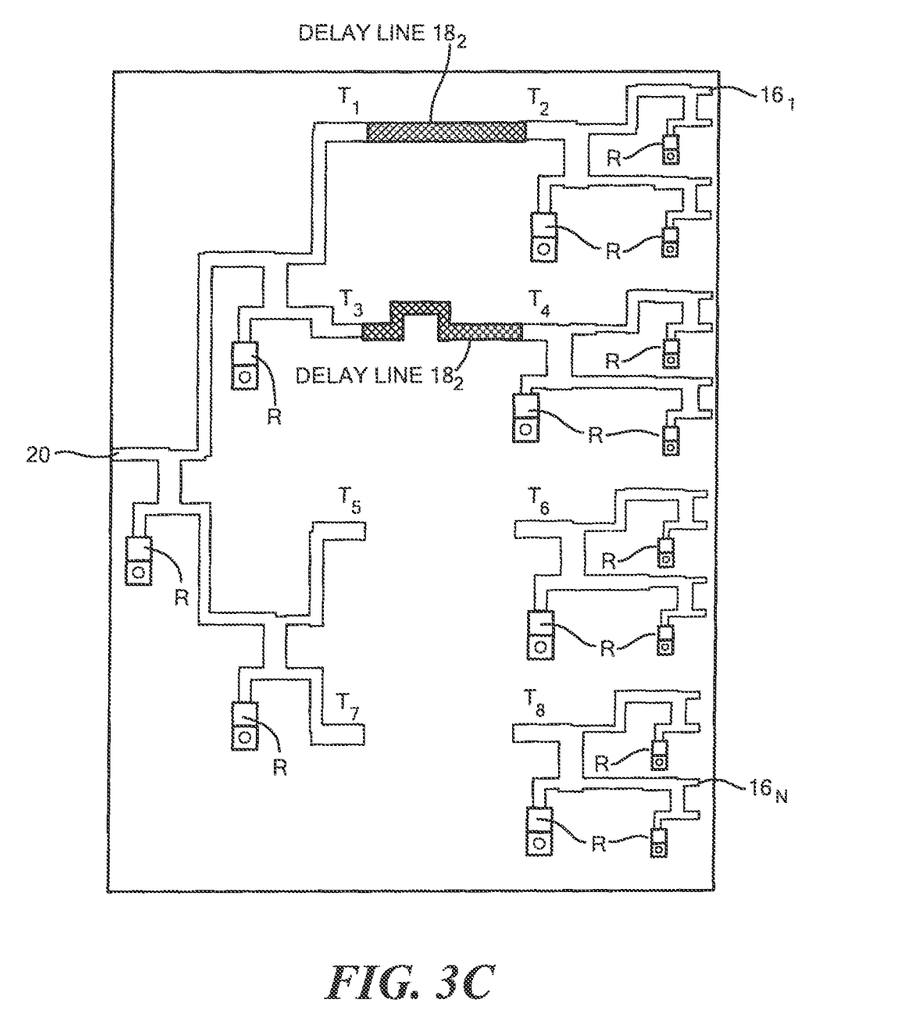

Next, the strip conductor of the microstrip transmission line for the second delay line $18_2$ is printed using additive manufacturing or 3D printing as shown in FIG. 3C.

Figure 3D:
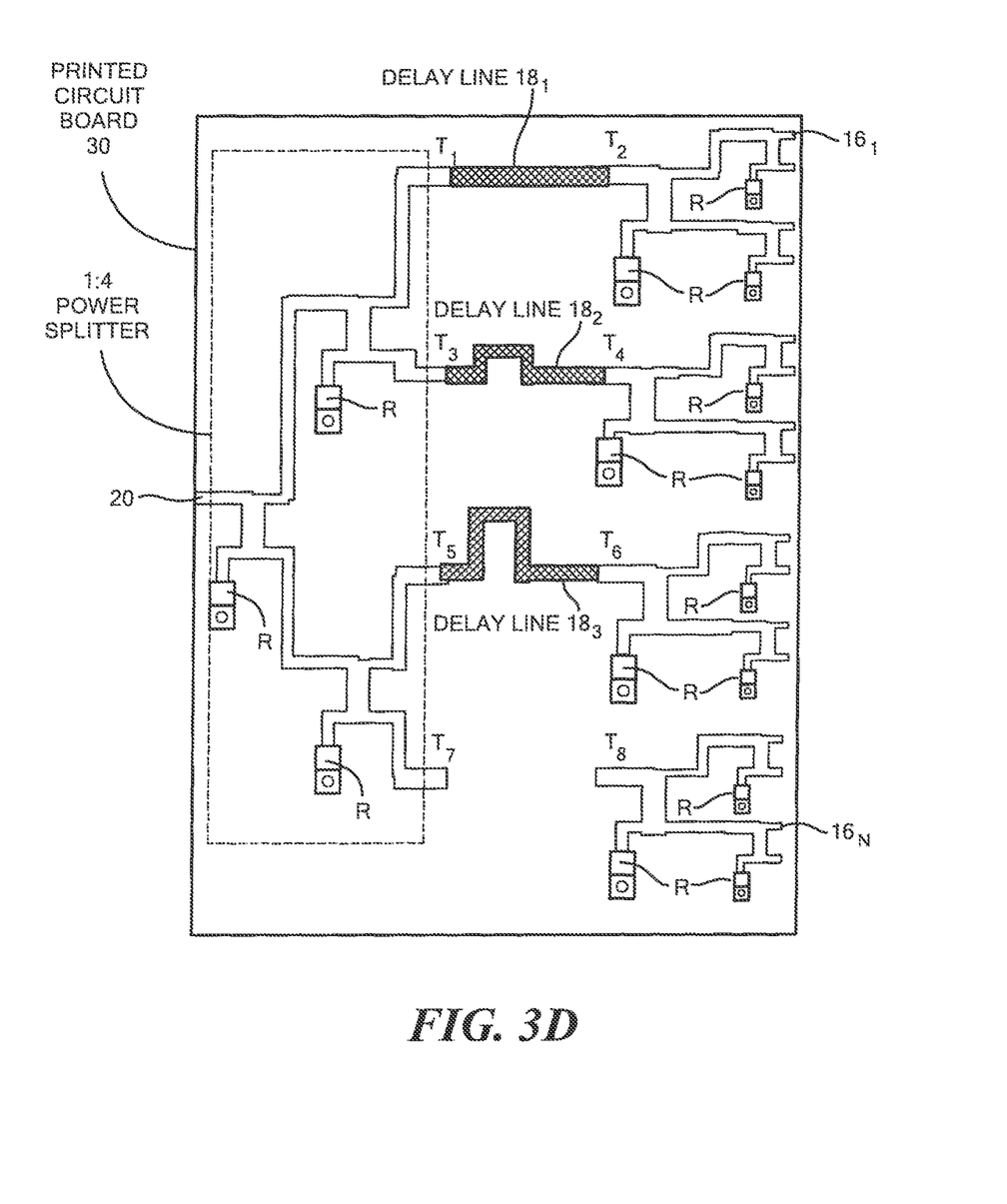

Next the strip conductor of the microstrip transmission line for the third delay line $18_3$ is printed using additive manufacturing or 3D printing as shown in FIG. 3D.

Figure 3E:
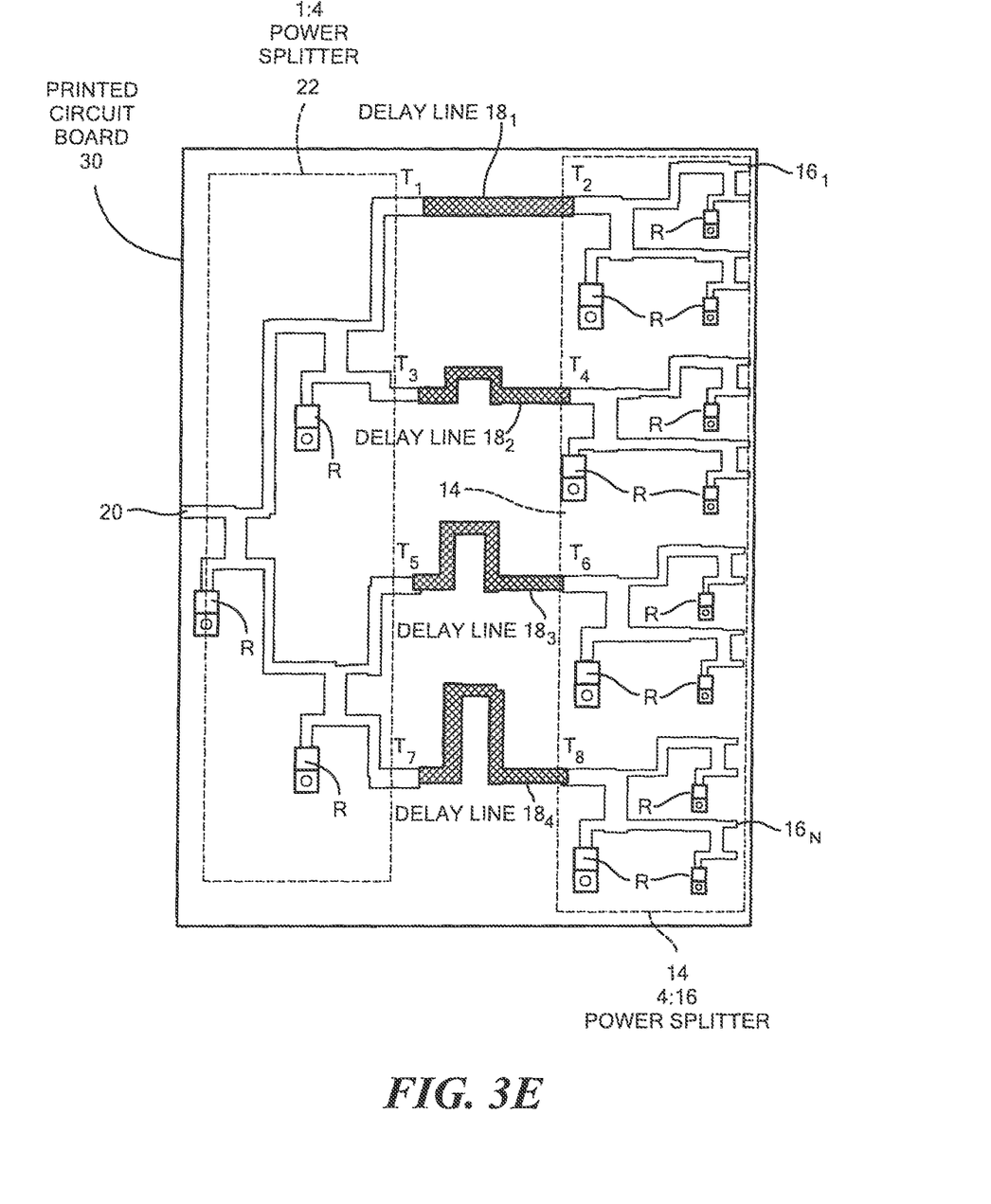

Finally, the strip conductor of the microstrip transmission line for the fourth delay line $18_4$ is printed using additive manufacturing or 3D printing as shown in FIG. 3E.

It should be understood that while in the example above the strip conductors of the microstrip transmission line for delay lines $18_1$-$18_4$ have been printed sequentially, they may be printed concurrently using for example a raster type motion for the 3D printing head.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A high power RF amplifier circuit comprising:
   a plurality of N power amplifier, where N is an integer greater than one, each one of the power amplifies having a predetermined phase shift;
   an M:N power splitter having M inputs, where M is an integer less than N, and N outputs, each one of the N outputs being coupled to an input of a corresponding one of the plurality of N power amplifiers;
   a plurality of M delay lines, each one of the M delay lines having a predetermined phase shift selected from minus twenty degrees to minus 50 degrees, each one the M delay lines having an output coupled to a corresponding one of the M inputs of the M:N power splitter, each one of the plurality of M delay lines being coupled to a common input of the high power RF amplifier circuit wherein a combination of the predetermined phase shift of each power amplifier combined with the predetermined phase shift of each one of the M delay lines provides a desirable phase shift as an output for each one of the power amplifiers.

2. The high power RF amplifier circuit recited in claim 1 wherein N is equal to 16 and M is equal to 4.

3. The high power RF amplifier circuit recited in claim 1 including a 1:M power splitter having M outputs, each one of the M outputs being coupled to an input of a corresponding one of the M delay lines.

4. The high power RF amplifier circuit recited in claim 3 wherein the M;N power splitter, the M delay lines, and the 1:M power splitter are disposed on a common printed circuit board.

5. The high power RF amplifier circuit recited in claim 1 wherein the N amplifiers are arranged in M amplifier module sections, each one of the M amplifier module sections having N/M of the amplifiers, each one of the N/M amplifiers in a corresponding one of the M amplifier module sections having a phase shift ($\Delta_1$+/−$\delta$) degrees through ($\Delta_M$+/−$\delta$) degrees, respectively, and where each one of the M delay lines has a phase shift $\Delta_1$ through $\Delta_M$ respectively.

6. The high power RF amplifier circuit recited in claim 5 wherein $\Delta_1$ is equal to minus 20 degrees, $\Delta_2$ is equal to minus 30 degrees, $\Delta_3$ is equal to minus 40 degrees, and $\Delta_M$ is equal to minus 50 degrees, respectively.

7. The high power RF amplifier circuit recited in claim 4, wherein the N amplifiers are arranged in M amplifier module sections, each one of the M amplifier module sections having N/M of the amplifiers, each one of the N/M amplifiers in a corresponding one of the M amplifier module sections having a phase shift $(\Delta_1+/-\delta)$ degrees through $(\Delta_M+/-\delta)$ degrees, respectively, and where each one of the M delay lines has a phase shift $\Delta_1$ through $\Delta_M$ respectively.

8. A high power RF amplifier circuit comprising:

a plurality of N power amplifiers, where N is an integer greater than one, each one of the power amplifiers having a predetermined phase shift wherein the N amplifiers are arranged in M amplifier module sections, each one of the M amplifier module sections having N/M of the amplifiers, each one of the N/M amplifiers in a corresponding one of the M amplifier module sections having a phase shift $(\Delta_1+/-\delta)$ degrees through $(\Delta_M+/-\delta)$ degrees, respectively;

an M:N power splitter having M inputs, where M is an integer less than N, and N outputs, each one of the N outputs being coupled to an input of a corresponding one of the plurality of N power amplifiers;

a plurality of M delay lines, where each one of the M delay lines has a phase shift $\Delta_1$ through $\Delta_M$ respectively, each one of the M delay lines having a predetermined phase shift selected from minus twenty degrees to minus 50 degrees, each one of the M delay lines having an output coupled to a corresponding one of the M inputs of the M:N power splitter, each one of the plurality of M delay lines being coupled to a common input of the high power RF amplifier combined with the predetermined phase shift of each one of the M delay lines provides a desirable phase shift at an output for each one of the power amplifiers.

\* \* \* \* \*